(12) United States Patent
Fujimori et al.

(10) Patent No.: US 6,382,419 B1
(45) Date of Patent: May 7, 2002

(54) WAFER CONTAINER BOX

(75) Inventors: Yoshiaki Fujimori; Masato Takahashi, both of Niigata-ken (JP)

(73) Assignee: Shin-Etsu Polymer Co. Ltd., Tokyo (JP)

( * ) Notice: Subject to any disclaimer, the term of this patent is extended or adjusted under 35 U.S.C. 154(b) by 0 days.

(21) Appl. No.: 09/551,959

(22) Filed: Apr. 19, 2000

(30) Foreign Application Priority Data

Apr. 20, 1999 (JP) .......................................... 11-112509

(51) Int. Cl.⁷ .............................................. B65D 85/48
(52) U.S. Cl. ........................ 206/454; 206/711; 206/832; 211/41.18
(58) Field of Search ................................ 206/454, 449, 206/445, 832, 710, 711, 712, 701; 211/41.17, 41.18; 141/98; 414/217, 416; 118/500

(56) References Cited

U.S. PATENT DOCUMENTS

| | | | | |
|---|---|---|---|---|
| 4,588,086 A | * | 5/1986 | Coe ........................... | 206/309 |
| 4,696,395 A | * | 9/1987 | Rivoli ........................ | 206/449 |
| 4,793,488 A | * | 12/1988 | Mortensen .................. | 206/454 |
| 5,772,700 A | * | 6/1998 | Choi ........................... | 118/500 |
| 5,788,082 A | * | 8/1998 | Nyseth ........................ | 206/711 |
| 6,006,919 A | * | 12/1999 | Betsuyaku ................... | 206/711 |
| 6,010,008 A | * | 1/2000 | Nyseth et al. ............... | 206/711 |
| 6,032,802 A | * | 3/2000 | Fjima et al. ................. | 206/711 |
| 6,036,031 A | * | 3/2000 | Ishikawa .................. | 211/41.18 |
| 6,082,540 A | * | 7/2000 | Krampotich ................ | 206/445 |
| 6,105,782 A | * | 8/2000 | Fujimori et al. ............ | 206/710 |

* cited by examiner

Primary Examiner—Shian Luong
(74) Attorney, Agent, or Firm—Reed Smith LLP

(57) ABSTRACT

Disclosed is a container box for storage and transportation of wafer materials or other precision substrate plates in the electronic industries as well as for automatic loading of the wafer materials on a wafer-processing machine. Several accessory parts can be mounted on the container box as selected according to the usage conditions of the container box so as to accomplish improvements in the weight decrease, handleableness and storage. The wafer container box consists of a box body having a front opening and a covering thereon and comprises an upper mounting means provided on the top wall of the box body for supporting a robotic flange, a lower side mounting means provided on the outer surface of each of the side walls of the box body for supporting a side rail, and a side mounting means provided on the outer surface of each of the oppositely facing side walls of the box body for supporting a manual handle, each in a demountable fashion.

6 Claims, 15 Drawing Sheets

WAFER CONTAINER BOX

BACKGROUND OF THE INVENTION

The present invention relates to a container box of a plurality of various wafer materials such as semiconductor silicon wafers, photomask glass plates, liquid crystal cells, recording media and the like for the purpose of storage, transportation or positioning of the wafer materials in mounting and demounting onto and from a processing machine therefor. More particularly, the invention relates to improvements relative to the material of the wafer container box and the mounting structure of various accessory parts of the wafer container box such as robotic flanges, side rails, manual handles and the like.

As a reflection of the very strong requirement for cost reduction of semiconductor devices, semiconductor silicon wafers as a typical class of wafer materials in the electronic industries are now under a continued trend for a rapid shift toward a larger and larger diameter of the wafers reaching or exceeding a diameter of 300 to 400 mm or even larger.

On the other hand, the patterning works to form a circuit pattern on the wafer is under a trend toward higher and higher fineness in order to increase the degree of integration of the semiconductor devices so much. A great increase in the fineness of circuit patterning on a semiconductor wafer cannot be accomplished naturally without upgrading of the cleanness of not only the processing lines and rooms for semiconductor processing but also the wafer container boxes for storage and transportation of the wafer materials before or under processing in an intermediate stage.

As a measure to comply with this requirement for the highest cleanness of the processing environment, a method is proposed in which certain key zones within the processing lines of semiconductor wafers only are kept under the highest cleanness in consideration of the high costs for keeping the highest cleanness over the whole processing lines and the wafer materials under processing are transferred between the key zones as contained in a hermetically sealable wafer container box in order to avoid contamination in the course of transportation. This method can of course be successful only with development of a wafer container box which is suitable for automatic transportation between processing zones and automatic exact loading/unloading of the wafer materials on and from the processing machine without least risks of contamination.

Though not shown by way of illustration, a wafer container box for storage and transportation of wafer materials as well as for loading/unloading of the wafer materials on and from a processing machine in the course of processing has a general structure consisting of a laterally opening body of the container box for holding a plurality of wafer materials in parallel alignment to avoid contacting of adjacent wafers and a covering which hermetically seals the lateral opening of the box body with intervention of an elastic gasket. The opening of the box body is engageable with a processing machine when the container box is set on the machine.

A pair of holding members, which serves to hold a plurality of wafer materials each in a horizontal disposition, are provided on the inside surfaces of oppositely facing side walls. A bottom plate, which may be a raised part equivalent to a bottom plate, is mounted on the bottom of the container box and the bottom plate is provided with a plurality of grooves each having an inversely V-formed cross section, referred to as V-grooves hereinafter, to serve for positioned mounting of the container box on a processing machine and penetrating holes for fixing the container box on a processing machine, referred to as retaining fixtures hereinafter.

A pair of bottom rails run on the bottom surface of the container box along the oppositely facing marginal lines of the bottom surface in the direction from the lateral opening to the rear wall opposite to the lateral opening. Each of the bottom rails is integrally shaped with the box body and the bottom plate. An elastic gasket is interposed between the lateral opening of the box body and the covering to ensure air-tight sealing when the covering is mounted on the opening of the box body. A latch mechanism, which can be operated from outside of the box, is built in the covering and the engagement hook of the latch mechanism is engaged with the lateral opening of the box body to ensure air-tightly sealed condition of the box.

The above mentioned holding members and the bottom plate are shaped separately from the body of the container box and they are fixed to the box body with intervention of an O-ring by means of a metal bolt or an engagement hook. When the wafer container box has to be cleaned by washing, accordingly, a number of these demountable parts are removed prior to washing and, after washing and drying of the box body, they are re-assembled to build up the container box. If washing of the container box is carried out without removing these demountable parts, the cleaning solution is unavoidably retained even by rinse within the narrow interstices between the demountable parts and the box body so that a quite long time is taken for complete drying of the washed box body.

Though not shown by drawings, wafer processing machines in general are equipped with a load port for mounting a wafer container box while a plurality of positioning pins having a semispherical end point and a means for fixing the wafer container box are provided on the upper surface of the load port. Accordingly, the wafer container box is positioned in place on the processing machine by a plurality of V-grooves and fixed to the position by means of the retaining fixture.

When wafers are to be processed by utilizing the above described assembly of apparatuses, the latch mechanism of the covering is first brought to disengagement so as to free the engagement hook from the engagement hole in the front of the container box enabling demounting of the covering which is in a position to close the front opening of the container box. Once the covering has been removed, the wafer materials mounted on the loading boat are taken out one by one from the container box and introduced into the processing machine where the wafer materials are processed.

In the current manufacturing process of semiconductor devices, proposals are made for preventing contamination of wafer container boxes by means of automatic transportation of the wafer container boxes in place of conventional manual transportation by the workers. The actual methods for the automatic transportation of wafer container boxes include the OHT (overhead hoist transportation) method in which the wafer container box is held at the robotic flange supported the flat plate 30 can be provided with one or more of fixing holes 33 in the areas excepting the end portions guide rail, AGV (automated guided vehicle) method in which the container box is transported under lifting by utilizing a pair of bottom rails provided on the bottom surface of the container box or a pair of side rails protruded out of the opposite side walls of the container box and PGV (person-guided vehicle) method. Besides, a method called the RGV (rail guided vehicle) method is known in which the mechanism for transportation of the wafer contained in the box is something resembling a monorail way.

In addition, an improvement of the manual transportation method by workers is proposed according to which manual handling of the wafer container box is facilitated by providing a pair of handles for grasping on both side walls of the container box body.

While the automatic transportation methods of wafer container boxes in the prior art can be classified into several types, it is usually the case that a particular wafer-processing step requires a specific transportation method selected from these types of the methods. Although the method utilizing a pair of bottom rails and robotic flanges is considered to be most versatile in respect of standardization of the process, this method can hardly be universal for all of the wafer processing steps. In practice, different transportation methods are employed in a single production line of the wafer processing steps in consideration of the specific conditions of the respective lines or the transportation method is necessarily limited to a specific method. It is sometimes the case that a specially designed transportation method not falling within the above described types must be adapted.

For example, while it is necessary in the transportation method utilizing bottom rails that the processing machine is provided on both sides with recessed parts or cavities on both sides for insertion of the pickup hooks of AGV and the like, this is not always possible depending on the structure of the processing machine. An alternative measure for this difficult problem is that, in place of providing side recesses on the processing machine, side rails to be protruded on both side walls of the container box at a height above the bottom on the body of the box rails in order to facilitate picking up of the container box body by means of an AGV and the like and these side rails are utilized for lifting up the box body kept in a horizontal disposition.

When the method of ceiling transportation is adapted by utilizing an OHT which requires that the ceiling height must be sufficiently large for installation of the OHT, it is sometimes a possible case that no space for installation of the OHT is available relative to the height of ceiling, especially, when a transportation mechanism must be introduced into an existing room of an old plant. When the method of ceiling transportation is adapted, in addition, a problem to be taken into consideration is that the robotic flange is provided to have a sufficiently high mechanical strength because the wafer container boxes currently under use may have a weight exceeding 7 kg when loaded with the full number of semiconductor silicon wafers.

In order to comply with each of these different transportation methods with a single type of wafer container boxes, the container box is required to be provided with parts of different structures for transportation. The transportation parts for actual service in a wafer processing plant are limited only to one or two types so that the other parts not in service are not only absolutely extraneous but also very deleterious due to an unnecessary increase in the weight and volume and troubles in handling relative to cleaning and storage.

For example, the robotic flanges and side rails are each a protrusion out of the surface of the box body. Since the side rails are each a protruded body having a protrusion height of 20 mm or larger and integrally molded with the box body, a great inconvenience is unavoidable in wrapping of the wafer container boxes with an aluminum foil-plastic film laminate and polyethylene film or by shrinkable wrapping for transportation and storage because of possible occurrence of pin holes in the wrapping films leading to eventual contamination of the wrapped container boxes. When the wafer processing plant is so designed as not to employ wafer container boxes having protruded side rails formed by integral molding, there may be a risk that the protruded side rails cause interference with other parts of the plant. Needless to say, a larger space must be provided for the cleaning works and storage of such wafer container boxes having protruded side rails corresponding to the volume occupied by the protruded side rails.

It is of course possible that the above mentioned specific parts for transportation are provided in a demountable fashion. While it is a usual way to ensure mechanical strengths of such demountable transportation parts by means of a plurality of screw bolts and nuts, difficulties are encountered in mounting and demounting of the transportation parts by using a so large number of the screw bolts in addition to the problems of an increase in the positioning error sometimes necessitating other special parts for exact positioning. Further, it is also possible to provide the container box with a pair of handles to facilitate manual handling of the boxes. Such handles, however, are useful only in the stage of trial manufacturing, in an emergency and in few of other steps not suitable for automatization such as product inspection and not useful in the routine manufacturing lines being rather obstructive in handling, transportation and storage and disadvantageous in costs.

On the other hand, it is sometimes the case in a part of the manufacturing lines of semiconductor devices that the semiconductor silicon wafers contained in the wafer container box are electrostatically charged at a high potential. A means undertaken to discharge the high-potential electrostatic charges by grounding to the mechanical part such as the load port is to form the supporting members, which are built to the body of the box as separate parts, from an antistatic material having a surface resistivity of $10^8$ ohm to $10^{13}$ ohm and the connecting part thereof to the body of the box is electrically connected through a separate electroconductive member to the robotic flanges, V-grooves, side rails or bottom rails equally made from an antistatic material.

Since the body of the wafer container box is made usually from an electrically insulating material which is transparent or translucent in order to ensure see-through visibility of the inside of the box, however, dust particles are unavoidably deposited and adsorbed onto the electrostatically charged surface of the box body under transportation within the production line so that the contaminants are brought into the environment of the wafer-processing sealed zones which must be kept in the highest cleanness resulting in various troubles. Further, the number of parts constituting the wafer container box is necessarily increased along with an increase in the costs for assemblage of parts and cleaning of the box since the box body is provided with electroconductive additive parts such as those having wafer alignment grooves.

SUMMARY OF THE INVENTION

The present invention, which has been completed in view of the above described various problems and disadvantages in the prior art wafer container boxes, accordingly has an object to provide a novel and improved wafer container box having adaptability to different ways of transportation by employing parts required for a specifically selected transportation method so as to improve interchangeability, lightness in weight, handleableness and storage performance. Another object of the invention is to provide a wafer container box on which the problem of dust particle deposition can be minimized even by the use of an electrically insulating transparent material to ensure see-through visibility for inspection of the inside of the box.

Thus, the present invention provides a wafer container box consisting of a body of the box opening in one lateral surface and a covering mountable on the opening of the box body for air-tight sealing of the container box, which comprises:

(a) two sets of wafer alignment grooves each integrally formed on the inner surface of one of oppositely facing side walls of the box body for supporting a plurality of wafer materials aligned up to down each in a horizontal disposition;

(b) a bottom plate fixed to the bottom surface of the box body;

(c) an upper mounting means provided on the top wall of the box body for supporting a robotic flange in a demountable fashion;

(d) a lower side mounting means provided on the outer surface of each of the side walls of the box body for supporting a side rail in a demountable fashion; and (e) a side mounting means provided on the outer surface of each of the oppositely facing side walls of the box body for supporting a manual handle in a demountable fashion, wherein the members selected from the robotic flanges, side rails and handles are supported selectively.

Characteristically, the above mentioned upper mounting means (c) comprises a guide rail provided on the top wall of the box body and an inclined guide surface formed in the guide rail with inclination gradually increasing from the end surface opposite to the lateral opening toward the lateral opening, and the robotic flange comprises a holding plate and supporting props provided on the lower surface of the holding plate to fit the guide rails as guided by the inclined guide surface.

Further characteristically, the above mentioned lower mounting means is formed in the form of an engagement rib provided on the outer surface of each side wall so as to define a space for insertion and the above mentioned side rail comprises a flat plate, an insertion part provided on the inward end of the flat plate for engagement with the engagement rib and a horizontal supporting plate provided on the outward end of the flat plate.

Still more characteristically, the above mentioned side mounting means comprises a guide rail provided on the outer surface of each side wall of the box body and an inclined guide surface with inclination gradually increasing from the end surface of the box body opposite to the opening toward the opening and the manual handle is constituted from a plate fitting the guide rail as being guided by the above mentioned inclined guide surface and a handle provided on the outer surface of the plate.

DETAILED DESCRIPTION OF THE PREFERRED EMBODIMENTS

Figure 1:
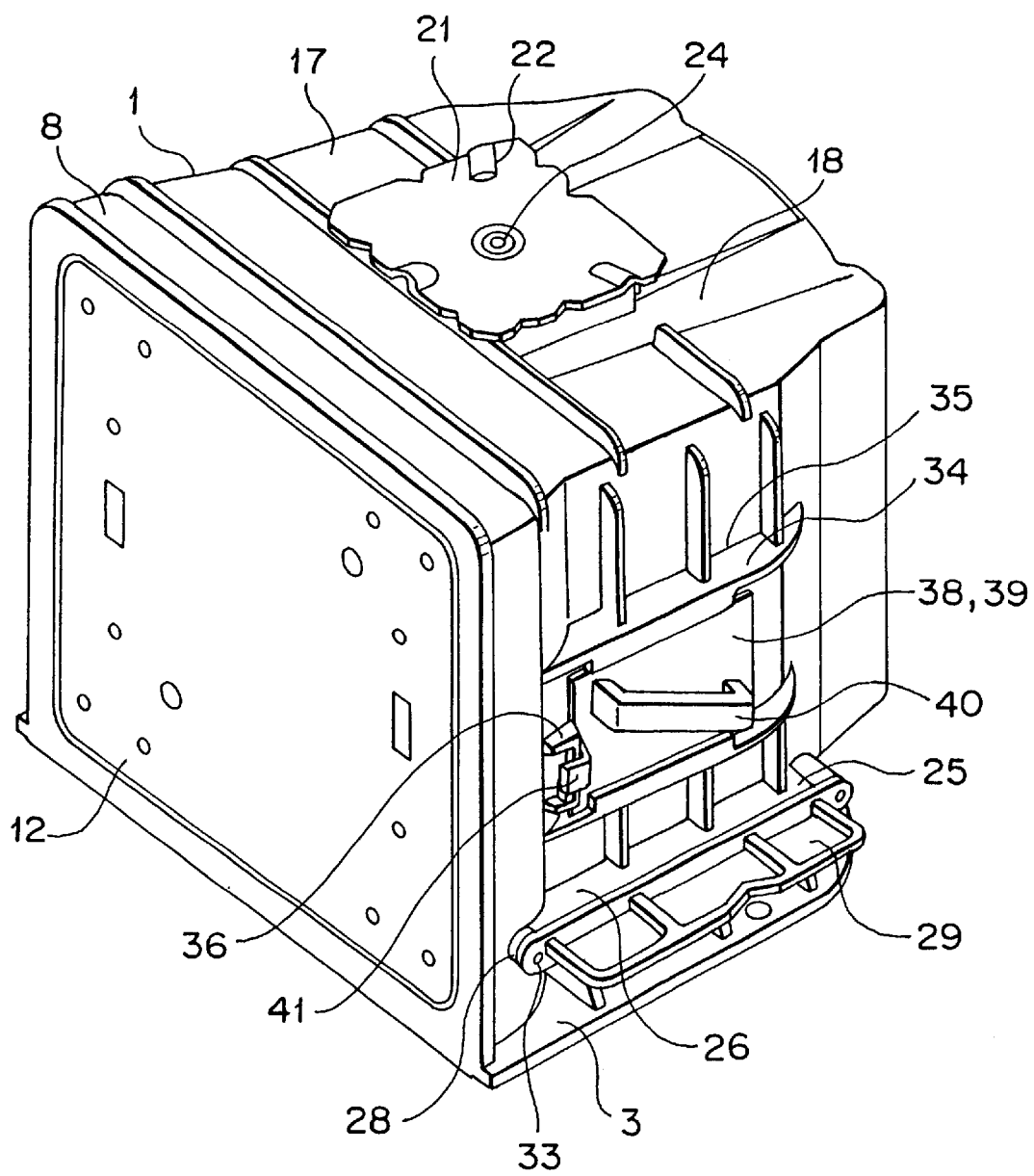
FIG. 1 is a perspective view of the inventive wafer container box in an embodiment

In the wafer container box of the invention defined in the SUMMARY given above, the box body for containing a plurality of wafer materials is open at one side and the opening is air-tightly sealed by mounting a covering thereon in a demountable fashion.

The wafer container box consisting of a body of the box opening in one lateral surface and a covering mountable on the lateral opening of the box body for air-tight sealing of the container box, comprises:

(a) two sets of wafer alignment grooves each integrally formed on the inner surface of one of oppositely facing side walls of the box body for supporting a plurality of wafer material aligned up to down each in a horizontal disposition;

(b) a bottom plate fixed to the bottom surface of the box body;

(c) an upper mounting means provided on the top wall of the box body for supporting a robotic flange in a demountable fashion;

(d) a lower side mounting means provided on the outer surface of each of the side walls of the box body for supporting a side rail in a demountable fashion; and (e) a side mounting means provided on the outer surface of each of the oppositely facing side walls of the box body for supporting a manual handle in a demountable fashion, It is preferable in the above described wafer container box of the invention that the upper mounting means (c) comprises a guide rail provided on the top wall of the box body and an inclined guide surface formed in the guide rail with inclination gradually increasing from the end surface opposite to the lateral opening toward the lateral opening, and the robotic flange comprises a holding plate and a supporting pillar provided on the lower surface of the holding plate to fit the guide rails as guided by the inclined guide surface.

Further preferably, the above mentioned lower mounting means is formed in the form of an engagement rib provided on the outer surface of each side wall so as to define a space for insertion and the above mentioned side rail comprises a flat plate, an insertion part provided on the inward end of the flat plate for engagement with the engagement rib and a horizontal supporting plate provided on the outward end of the flat plate.

It is also preferable that the above mentioned side mounting means comprises a guide rail provided on the outer surface of each side wall of the box body and an inclined guide surface with inclination gradually increasing from the end surface of the box body opposite to the opening toward the opening and the manual handle comprises a plate fitting the guide rail as being guided by the above mentioned inclined guide surface and a handle provided on the outer surface of the plate.

Needless to say, the materials to be contained in the inventive wafer container box are not limited to semiconductor silicon wafers but can be photomask glass plates, liquid crystal display panels, disk-formed recording media and other wafer-formed precision plate materials. The wafer container box of the invention contains usually a plurality of these wafer materials in a number of as many as several tens. The body of the box, covering, bottom plate and robotic flange constituting the container box are formed from a plastic resin composition having as sufficiently high mechanical strength and capable of exhibiting a permanent antistatic effect as composed of a base resin such as polycarbonates, acrylic resins, PEEK resins and the like compounded with an electroconductive resin to give a polymer alloy or electroconductive fibrous materials such as carbon fibers, metal filaments and the like to give a composite. It is of course possible that a shaped article of a conventional thermoplastic resin is imparted with surface conductivity by forming a coating layer of an electroconductive resin.

Although it is specified in the SEMI Standards as a Front-opening Interface Mechanical Standard, 300 mm, that the covering of the wafer container box should have a latch mechanism for fastening to the body of the box, it is optional that the covering is fastened to and released from the box body by means of another mechanical means in place of the latch mechanism. The cross sectional profile of the guide rails is not particularly limitative including dovetails. The supporting props may have an approximately J-formed or H-formed cross section. The plate is not limited to a flat plate provided that it has a configuration engageable with the guide rails to work in a similar way. It is optional that a hook is provided at the end portion of this plate in order to come into engagement with a protrusion or recess in the body of the container box.

In the wafer container box of the present invention, the accessory parts such as robotic flanges, side rails and manual handles to be mounted on the box body can be limited to those actually needed for the respective layout of the manufacturing plants, process step and transportation method with omission of unnecessary ones. In addition, the wafer-aligning and supporting grooves are formed integrally on the inner surface of each side wall so that any separate parts need not be built in the box body. This simplification relative to the accessory parts greatly contributes to the improvement in the efficiency of cleaning and drying of the box body if not to mention the advantages obtained by the weight decrease as a matter of course.

In the following, a preferable embodiment of the inventive wafer container box is described in more detail by making reference to the accompanying drawing although the scope of the invention is never limited thereto in any way.

As is shown in FIGS. 1 to 15, the inventive wafer container box consists of a body 1 of the box which contains a plurality of wafer materials W in parallel alignment and a covering 12 mounted on the body 1 to air-tightly seal the front opening of the box body 1 with intervention of an elastic gasket 11 in a demountable fashion. The box body 1 is provided with a bottom plate 14, upper mounting means 17 for supporting a robotic flange 21, lower side mounting means 25 for supporting a pair of side rails 29 and side mounting means 34 for supporting a pair of manual handles 38.

The box body 1 is shaped in the form of a front-opening box from a basically opaque thermoplastic resin having excellent impact strength, heat resistance, water resistance and acid-resistance such as a polycarbonate resin and imparted with a permanent antistatic effect by compounding or coating with a permanent antistatic agent. The box body 1 has a sufficiently high mechanical strength to withstand mechanical shocks and the surface resistivity thereof is preferably in the range from $10^8$ ohm to $10^{13}$ ohm as determined according to the procedure specified in ASTM D257. As is shown in FIGS. 2, 8, 13 and 15, the inner surface of each of the oppositely facing side walls is shaped in the form of pleats to form wafer-alignment grooves 2 having a U-formed cross section at a regular pitch from up to down to support a plurality of wafer materials W each in a horizontal disposition something like shelves. Thus, a plurality of wafer materials W are horizontally held by the alignment grooves 2 in parallel alignment without contacting with the adjacent wafer materials.

Figure 2:
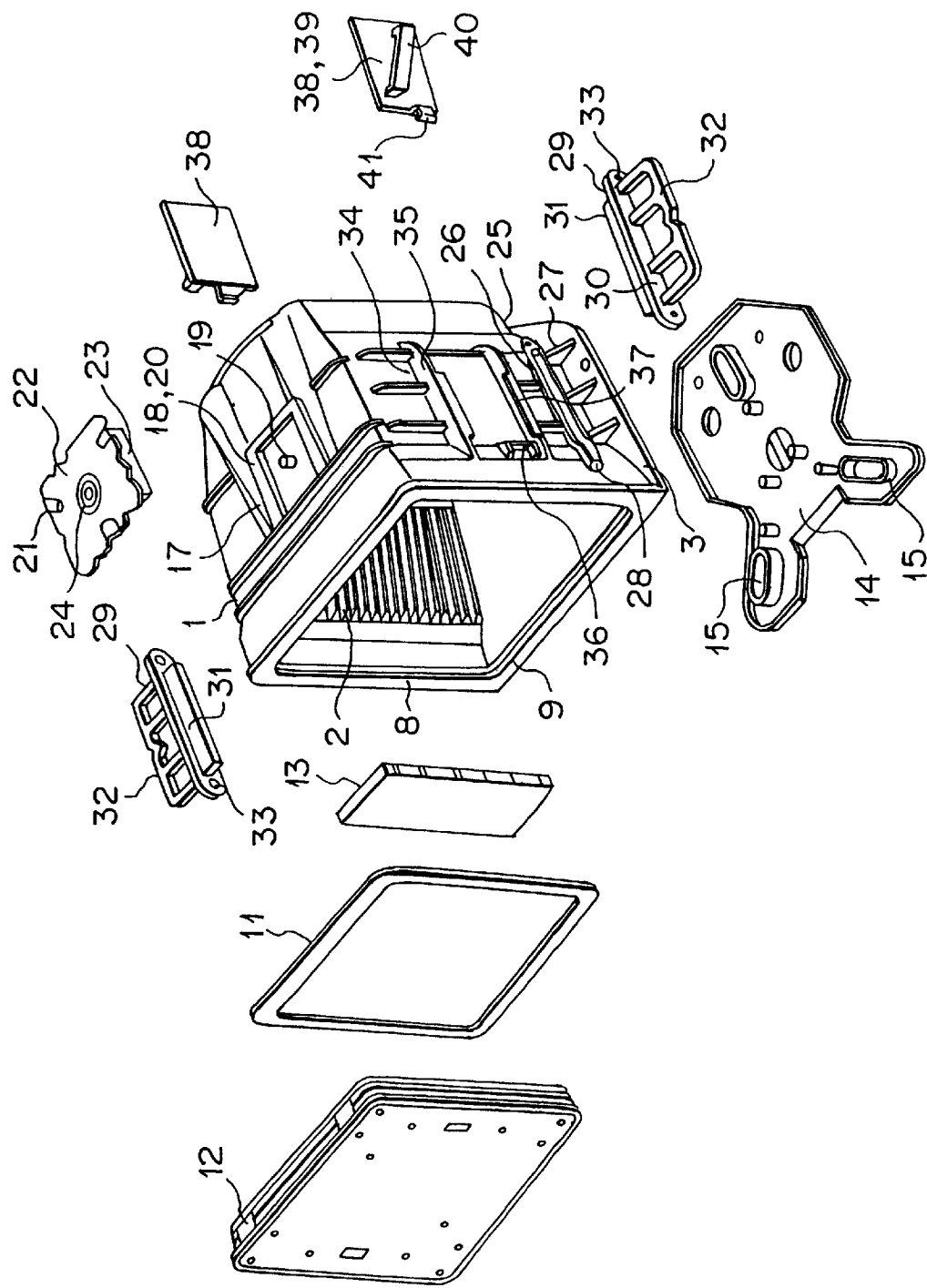
FIG. 2 is a perspective view of the inventive wafer container box disassembled into parts.
Figure 3:
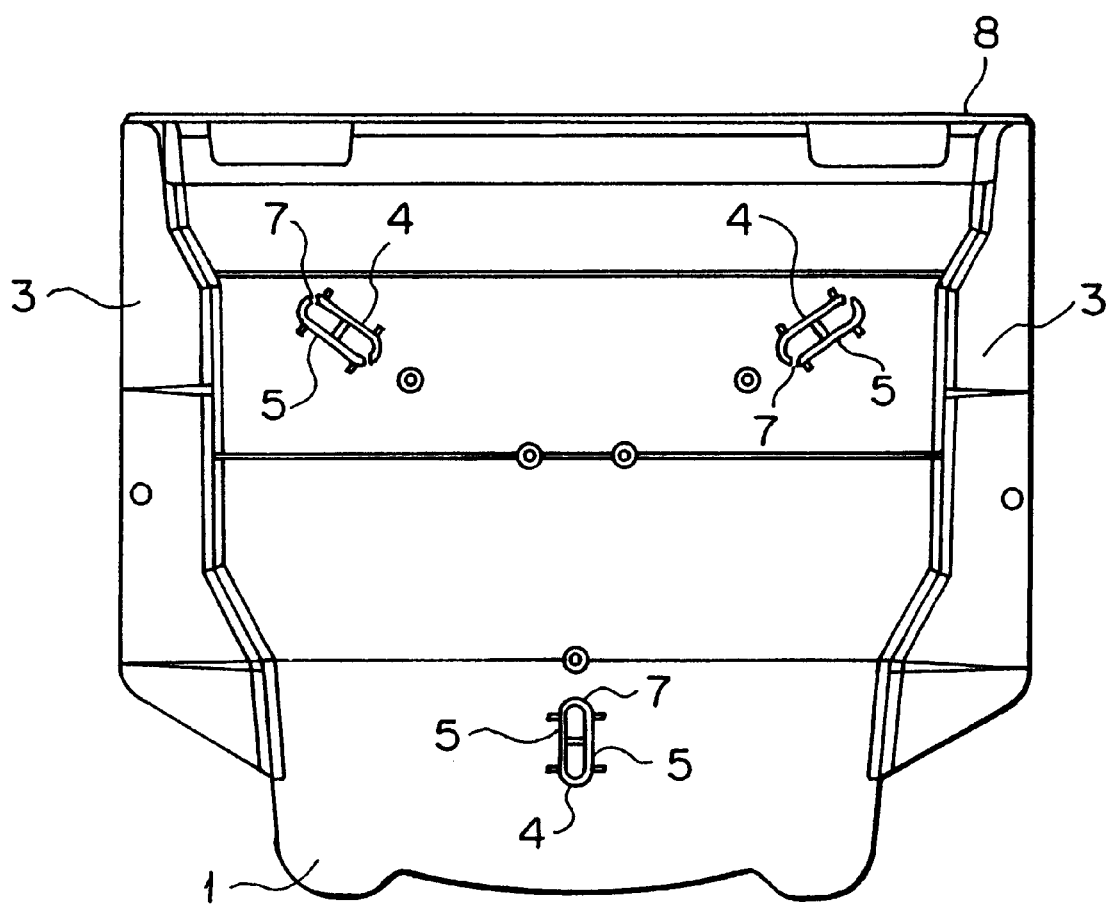
FIG. 3 is a bottom view of the body of the inventive wafer container box.

As is shown in FIGS. 1 to 4 and 13, a pair of protruded bottom rails 3 are integrally shaped with the bottom wall of the box body 1 along the right and left peripheries of the bottom surface to extend in the direction from front to rear. The bottom rails 3 facilitate picking up of the box body 1. As is shown in FIG. 3, the bottom surface of the box body 1 is provided on three positions including two side positions near to the front end and one center position near to the rear end as is specified in the SEMI Standards with integrally shaped V-grooves 4 to serve as a positioning means forming protrusions. A bottom plate 14 is mounted on these V-grooves either directly or by means of fastening clamps in a demountable fashion.

As is illustrated in the same figure, each of the V-grooves 4 consists of a pair of side ribs 5 defining an approximately oval space and a reinforcement rib bridging the side ribs 5 and serves as a positioning means of the box body 1 when the box body 1 is mounted on a wafer-processing machine by being engaged with the positioning pins 6 (see FIG. 5) of the wafer-processing machine. Each of the side ribs 5 forming each of the two front V-grooves 4 has an approximately J-shaped configuration and the two J-shaped side ribs 5 jointly define an oval space surrounded thereby leaving gaps 7 between the end points of the counterposed side rib 5. These gaps 7 between the J-shaped side ribs 5 serve as a drain notch in the cleaning work and air passage in drying. The other V-groove 4 at the center rear can also be shaped in the same fashion as described above although it is depicted in FIG. 3 in a different fashion to have gaps 7 between the two side ribs 5 at the end positions of the oval space defined by the side ribs 5.

Figure 10:
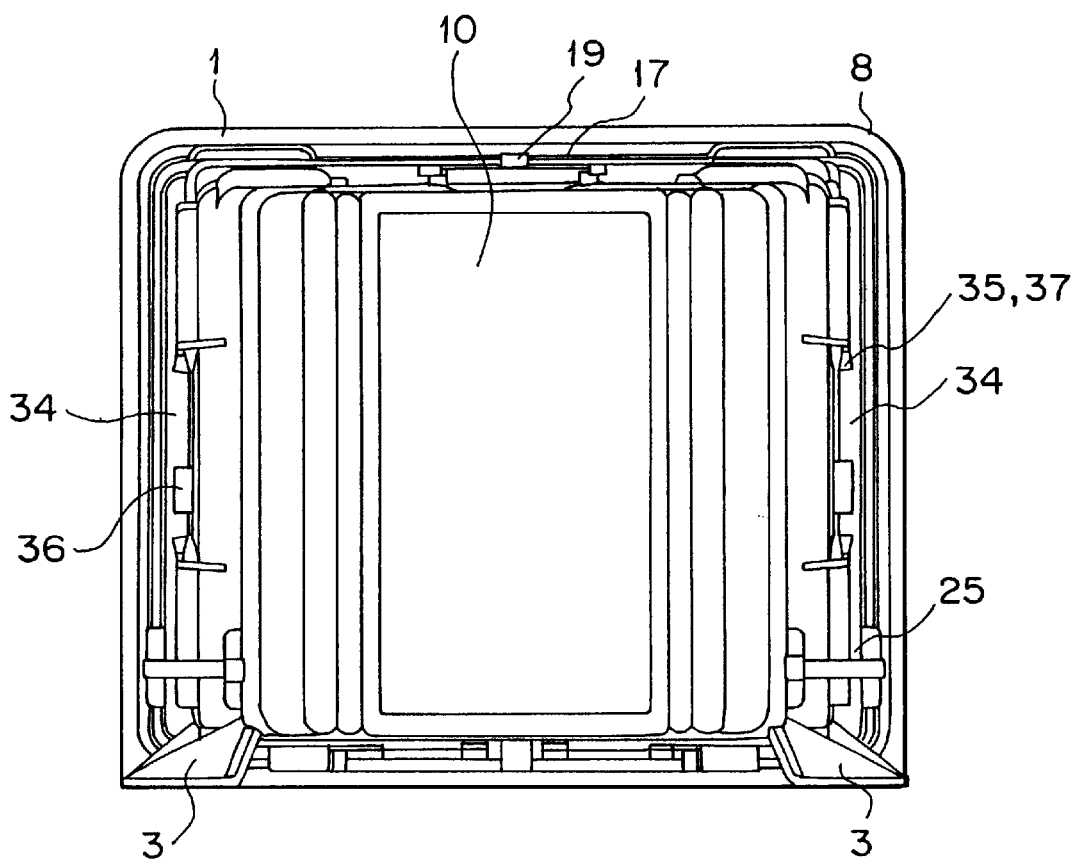
FIG. 10 is a rear view of the inventive wafer container box.
Figure 11:
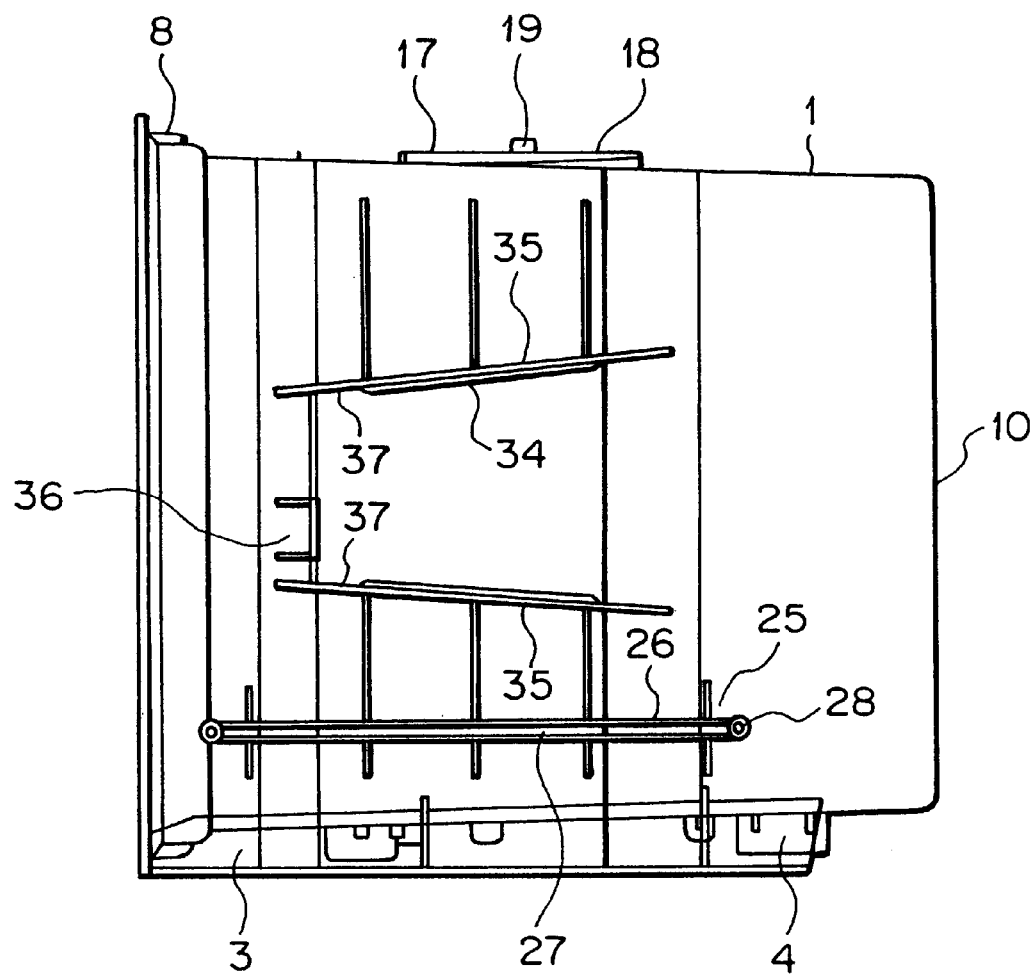
FIG. 11 is a side view of the inventive wafer container box.
Figure 12:
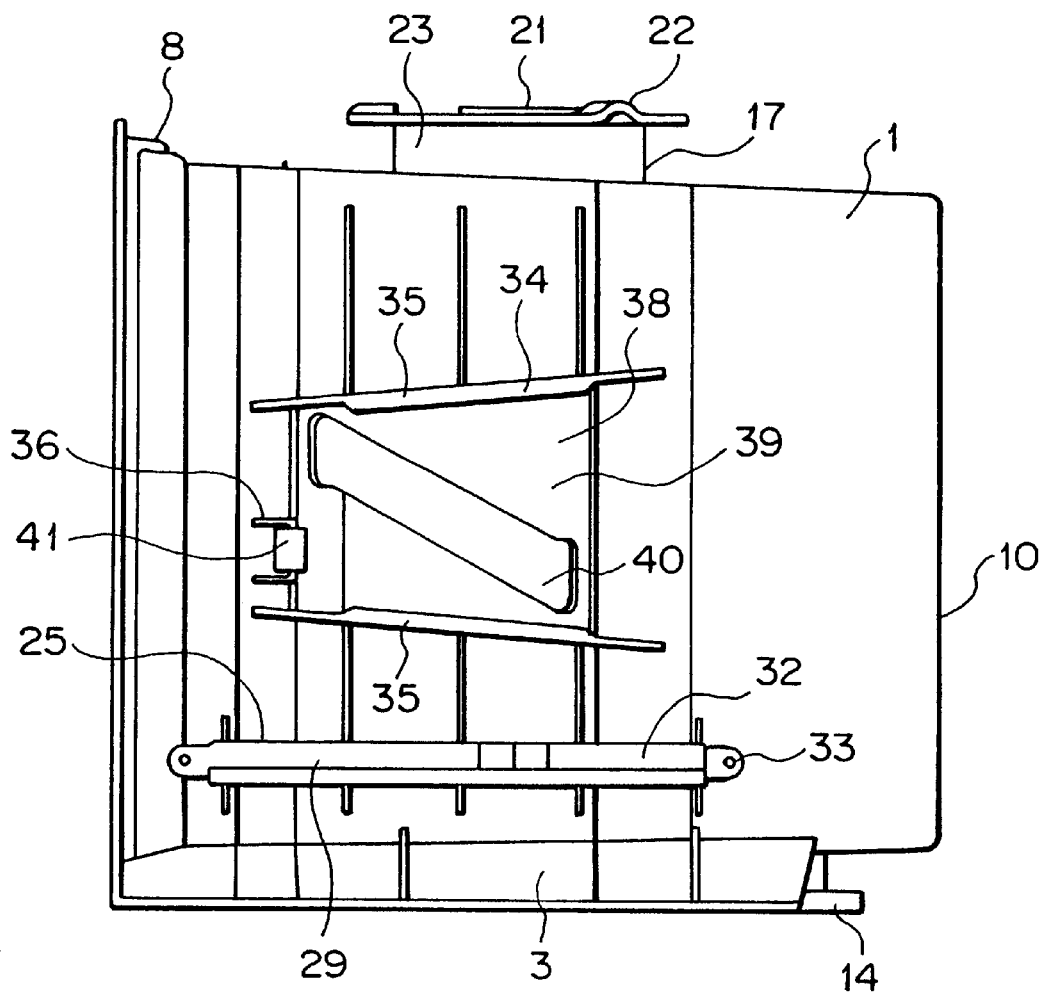
FIG. 12 is a side view of the inventive wafer container box illustrated in FIG. 11 supporting a manual handle and a side rail.
Figure 13:
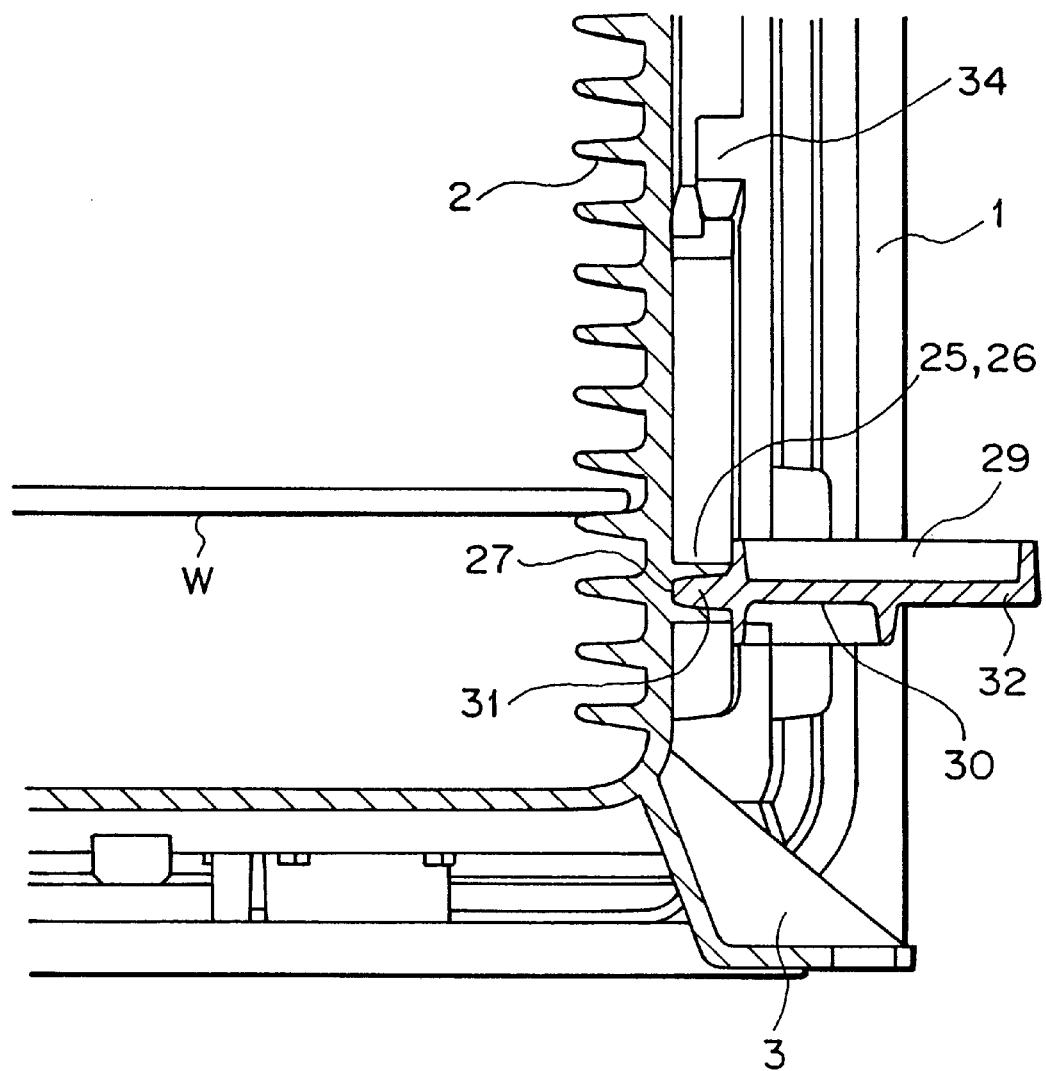
FIG. 13 is partial cross sectional view of the box body of the inventive wafer container box supporting a side rail as cut and viewed along the line XIV—XIV in FIG. 7.
Figure 14:
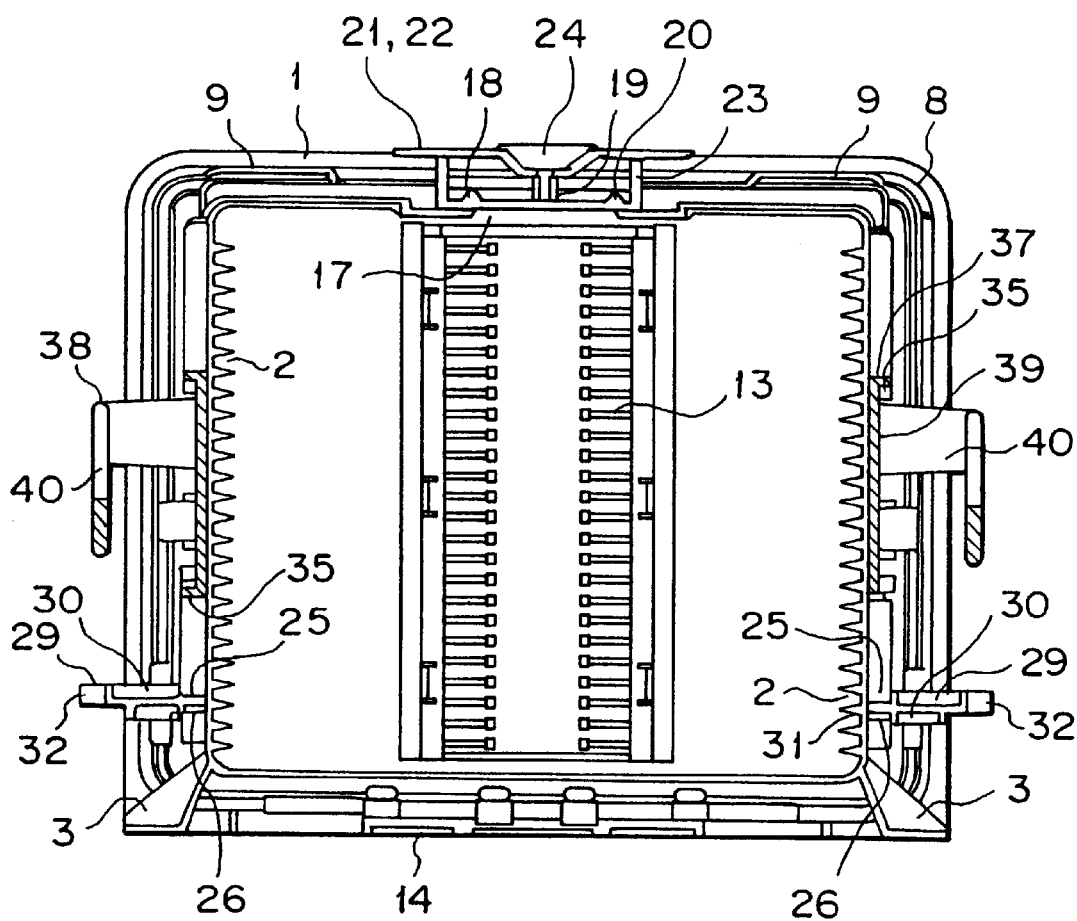
FIG. 14 is a cross sectional view of the box body as cut and viewed along the line XIV—XIV in FIG. 7.
Figure 15:
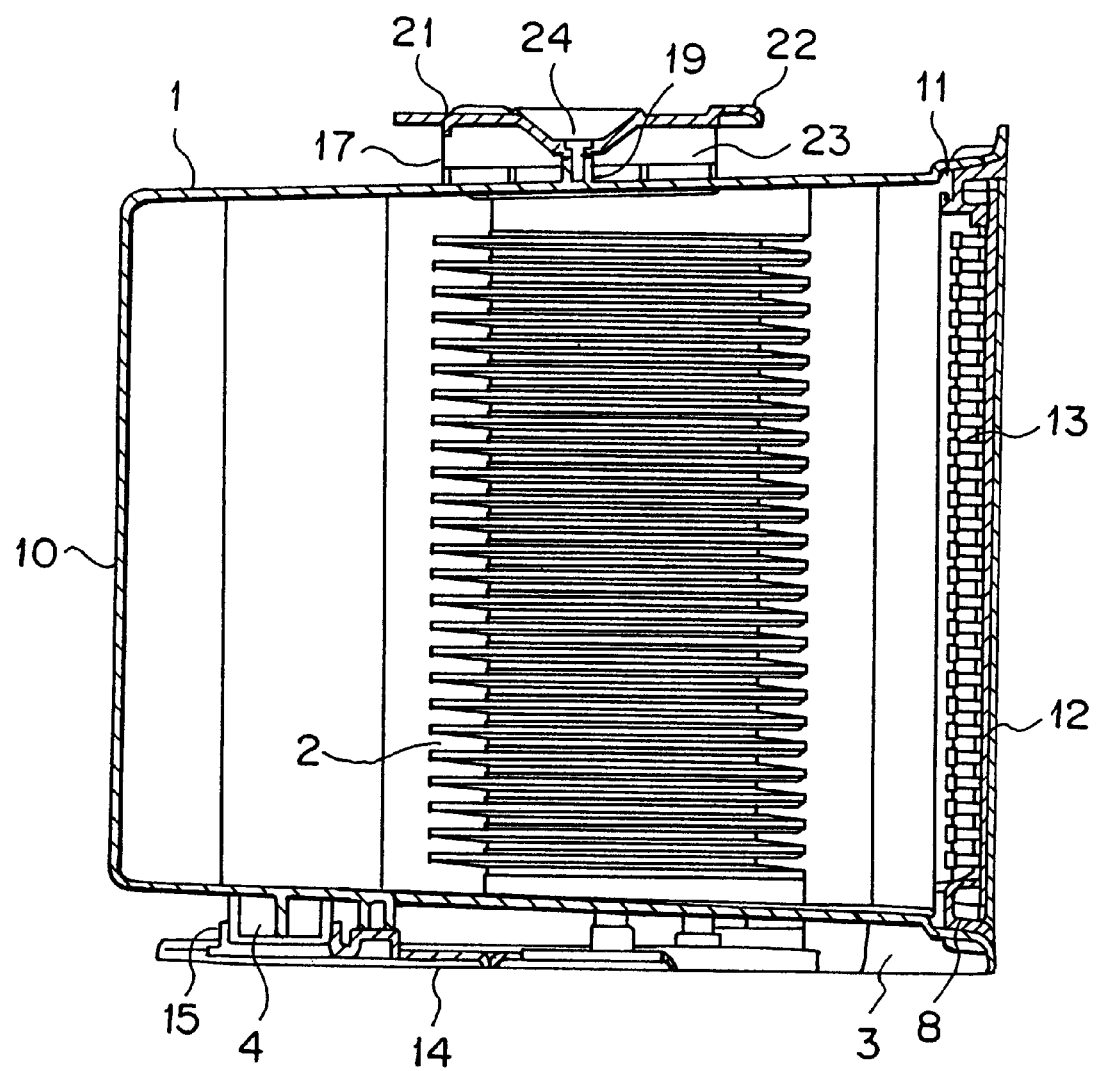
FIG. 15 is a cross sectional view of the box body as cut and viewed along the line XV—XV in FIG. 7.

The front opening of the box body 1 is surrounded by rims 8 extending in the up to down directions and in the left to right directions. These rims 8 are provided at the upper and lower side positions on the inward surface with cavities 9 to serve as an engagement means. The lower rim 8 is integrally connected at the side ends with the front end of each of the bottom rails 3. As is illustrated in FIG. 10, a rectangular see-through window 10 is formed in the rear wall of the box body 1 by using a highly transparent polycarbonate resin to facilitate checking, without removing the covering, of the alignment condition of all the wafer materials W contained in the container box 1 by being supported at the peripheries.

If the transparent plastic resin forming the see-through window has bondability with the plastic resin forming the box body, the see-through window can be built in the box body by the techniques of insert molding or two-color molding without using any adhesives sometimes responsible for contamination of the wafer materials contained in the container box. It is of course possible that a see-through window is formed, in addition to the rear wall of the box body 1, in each of the top wall and side walls of the box body 1.

The gasket 11, which intervenes between the covering 12 and the periphery of the front opening of the box body 1 to ensure air-tight sealing, has a frame-like configuration and shaped by molding an elastic material having excellent weatherability, anti-chemicals resistance, aging retardancy and electric properties including a variety of thermoplastic elastomers and rubbers such as fluorocarbon rubbers, EPDM rubbers, polychloroprene rubbers, butyl rubbers and silicone rubbers. It is preferable that the gasket 11 is sandwiched between a groove and a line protrusion formed on the periphery of the covering 12 and around the front opening of the box body 1 in order to further improve air-tightness of sealing with the gasket 11.

The covering 12, which is shaped from the same plastic resin as the box body 1, has a double-walled structure with a void space. Though not shown in the figures., a latch mechanism is built in the covering 12 in order to enable automatic clamping and declamping on a wafer-processing machine. The latch mechanism is connected to the engagement hooks capable of appearing and retreating as protruded out of the outer periphery of the covering 12. When the covering 12 is mounted on the front opening of the box body 1, these engagement hooks are inserted into and engaged with the engagement cavities 9 around the front opening of the box body 1. As is shown in FIG. 2, one or more of retainers 13 are mounted on the inward surface of the covering 12, The retainer has elastic members with a V-shaped or U-shaped cross section to receive the peripheries of the wafer materials W contained in the box body 1 with resilience when the covering 12 is mounted on the front opening of the box body 1.

The retainer 13 is shaped from a variety of thermoplastic elastomers and thermoplastic resins such as polyethylene and polypropylene. It is preferable, however, in respect of high heat resistance and rigidity, that the retainer 13 is shaped from a polycarbonate resin, polybutylene terephthalate resin, polyether ether ketone resin or polyether imide resin or, more preferably, from a polyether ether ketone resin which is safe from the phenomenon of fatigue by repeated deformation. It is important that the retainer 13 has heat resistance so high that, even when the wafer materials W coming into contact with the retainer 13 have a surface temperature as high as 80 to 150° C., the retainer 13 is safe from the troubles such as thermal deformation and melt-bonding with the wafer materials W.

Figure 4:
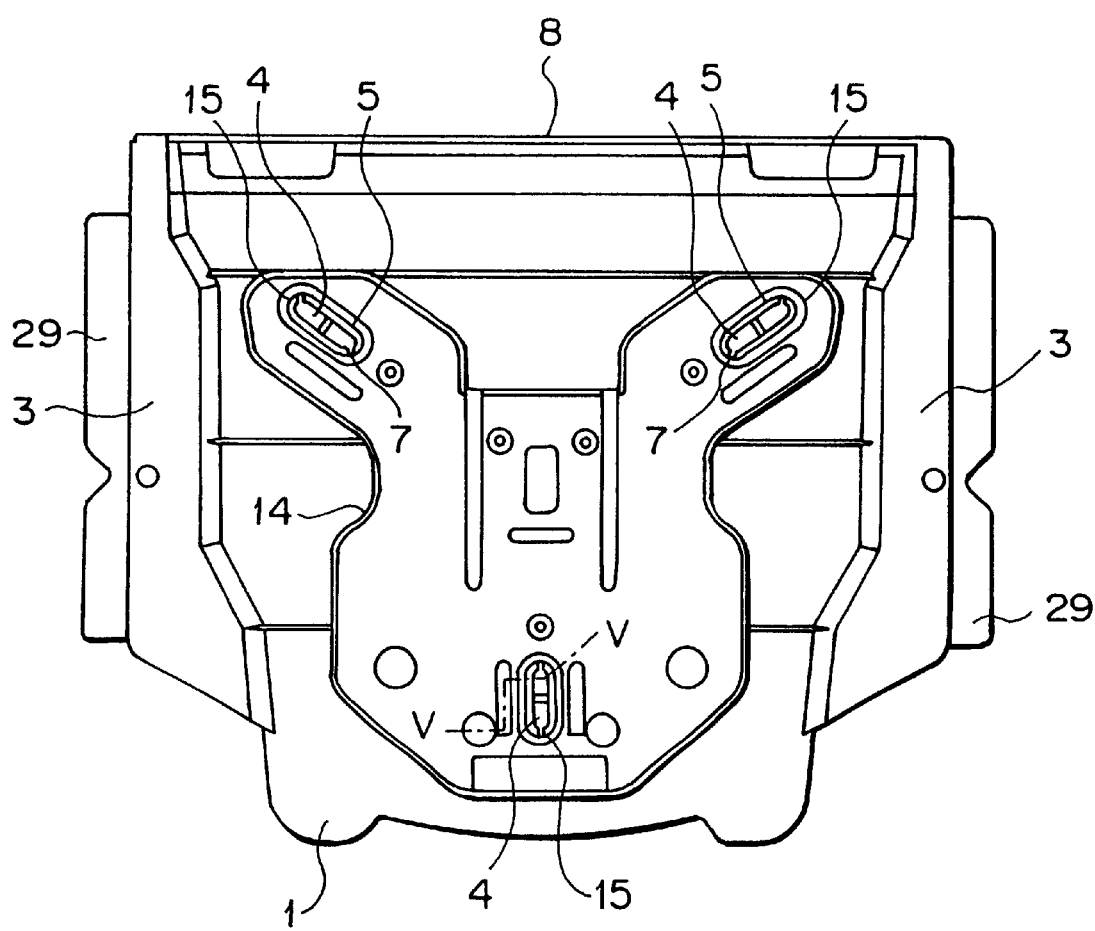
FIG. 4 is a bottom view of the box body illustrated in FIG. 3 supporting a bottom plate.
Figure 5:
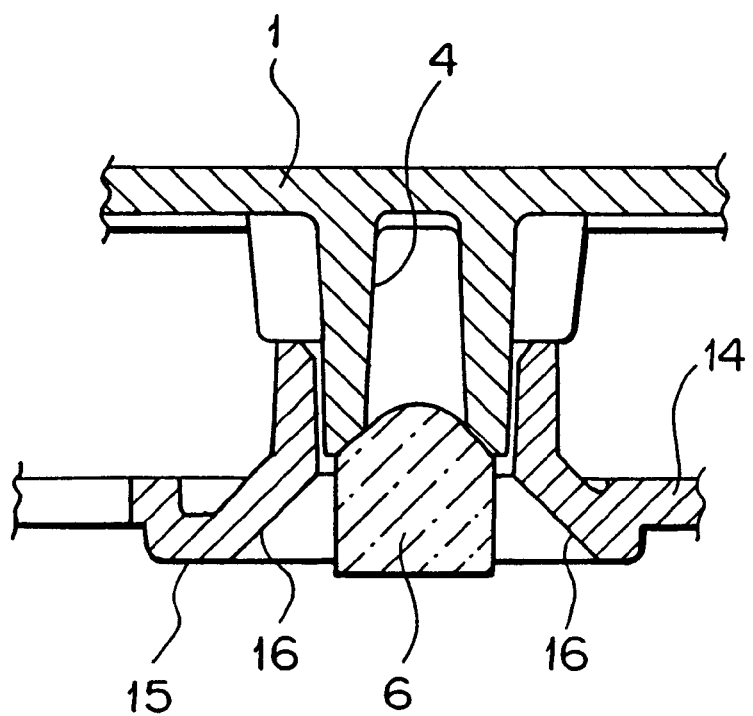
FIG. 5 is a cross sectional view of the bottom plate as cut and viewed along the line V—V in FIG. 4.
Figure 6:
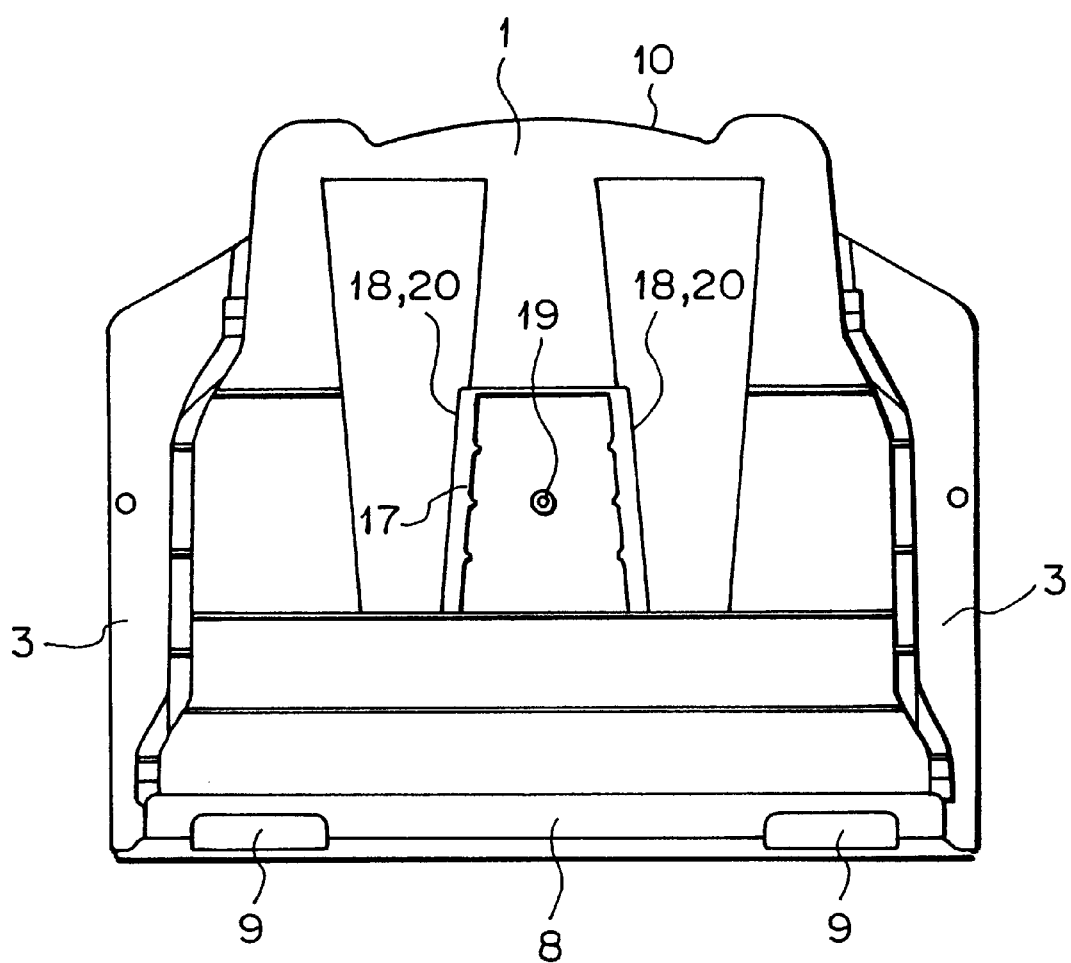
FIG. 6 is a plan view of the box body of the inventive wafer container box.
Figure 7:
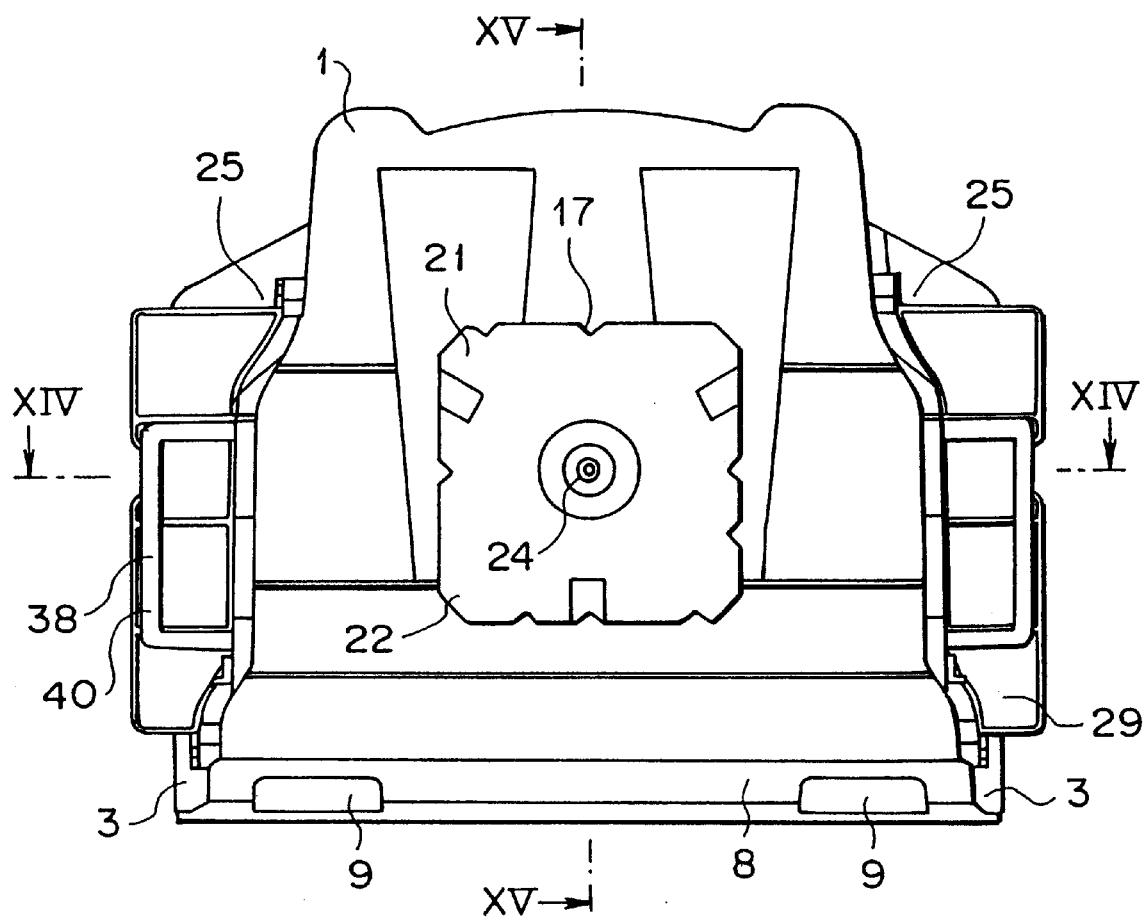
FIG. 7 is a plan view of the box body illustrated in FIG. 6 supporting a robotic flange.
Figure 8:
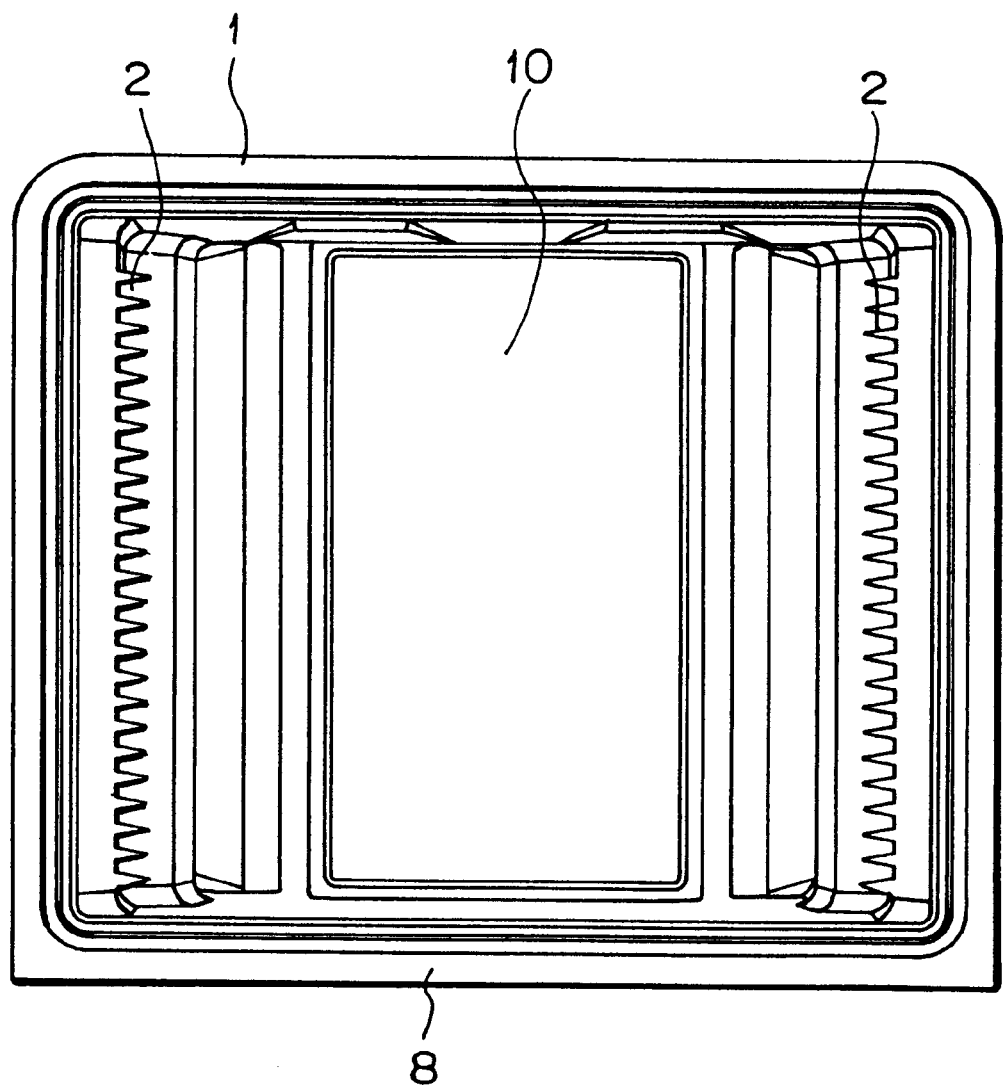
FIG. 8 is a front view of the inventive wafer container box with the covering removed.
Figure 9:
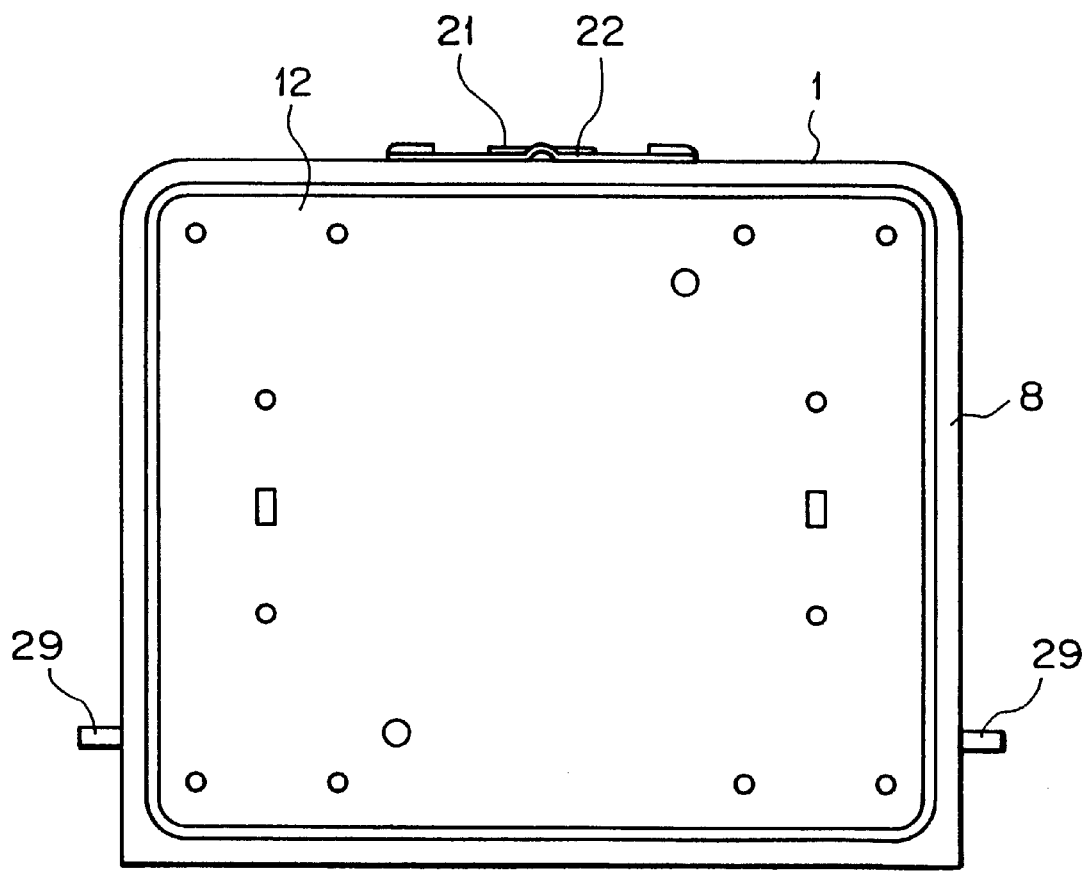
FIG. 9 is a front view of the inventive wafer container box with the covering mounted on the front opening.

As is illustrated in FIGS. 2 and 4, the bottom plate 14 has a generally Y-shaped configuration and has three approximately oval guide members 15 integrally shaped on the two front side positions and a center rear position each to fit and to be engaged with one of the V-grooves 4 on the bottom surface of the box body 1. The guide member 15 has a cross section illustrated in FIG. 5 with an upwardly narrowing inclined surface 16 which serves as a guide surface for the positioning pin 6 on the wafer-processing machine toward the V-groove 4. It is also possible that the guide members 15 are shaped, instead of integral molding, as separate parts from the bottom plate 14, and mounted thereon. When the guide members 15 are shaped as separate parts, the plastic resin for molding the guide members 15 should be a resin having excellent abrasion resistance such as polyether ether ketone resins, polybutylene terephthalate resins and polycarbonate resins or a plastic resin compounded with an abrasion-resistance improver such as a powder of a polytetrafluoroethylene resin.

As is illustrated in FIGS. 1, 2, 6 and 14, the upper mounting means 17 consists of a pair of oppositely facing guide rails 18 extending in the front-to rear direction and a threaded boss 19 protruded between the right and left guide rails 18. Each of the guide rails 18 has an inversely L-shaped cross sectional profile to stand on the top surface of the box body 1. While the robotic flange 21 is to be inserted between the guide rails 18 from the rearward end, each of the paired guide rails 18 has a height gradually and slightly increasing from the rearward end toward the frontward end keeping a distance therebetween gradually and slightly increasing from the rearward end toward the frontward end. The outer side surface of each guide rail 18 forms an inclined guide surface 20 gradually expanding outwardly from the rearward end toward the frontward end.

The robotic flange 21 is shaped by molding of a thermoplastic resin such as polycarbonate resins, polyamide resins, ABS resins and PBT resins. As is shown in the same figures, the robotic flange 21 consists of a grasping plate 22 to be grasped and positioned on an OHT transportation machine and a pair of props 23 downwardly protruded from the lower surface of the grasping plate 22. The grasping plate 22 is provided at the center position with a tapered threaded hole 24 to which the threaded boss 19 on the upper mounting means 17 is inserted to fasten the robotic flange 21 by screwing with a fastening means such as a bolt and the like. Each of the downwardly protruded props 23 is bent in an L-shaped form of a hook which comes to engagement with one of the guide rails 18 having an inversely L-shaped cross section on the upper mounting means 17. Thus, the robotic flange 21 having the above described structure is guided by the inclined guide surfaces 20 and becomes engaged with the guide rails 18 under fittingness increasing from the rearward end toward the frontward end to be mounted on and fixed to the mounting means at a proper mounting position in a demountable fashion.

As is illustrated in FIGS. 1, 2 and 11 to 14, each of the lower side mounting means 25 consists of an upper and lower engagement ribs 26 integrally shaped with each of the side walls at the outer lower position with a plurality of reinforcement ribs bridging the engagement ribs 26. These upper and lower engagement ribs 26, which define an insertion space 27, each extend in the front-to-rear direction and is provided with a threaded fixing boss 28 at each of the front and rear ends.

As is illustrated in the same figures as above, each of the side rails 29 is provided with a flat plate 30 extending in the front-to-rear direction and an insert 31, which is to be inserted into the insertion space 27 between the engagement ribs 26 in a demountable fashion, is integrally formed along the inside periphery of the flat plate 30 together with reinforcement ribs. The outer periphery of the flat plate 30 extends to form a horizontal supporting plate 32 with reinforcement ribs to facilitate lifting of the box body 1. A fixing hole 33 is formed at each of the front and rear ends of the flat plate 30, into which the fixing boss 28 is inserted and fixed thereto by screwing with a fastening means such as a bolt, which is shaped from a plastic resin such as a polycarbonate resin and polyether ether ketone resin in consideration of cleaning treatment of the ox body 1.

As is illustrated in FIGS. 1, 2, 11 and 12, each of the side mounting means 34 consists of a pair of guide rails 35 oppositely facing up and down on the outer surface of each of the side walls of the box body 1 as integrally shaped together with a plurality of reinforcement ribs and an engagement cavity 36 formed between the front ends of the upper and lower guide rails 35. The upper and lower guide rails 35 are positioned in such a fashion that the vertical distance therebetween is gradually decreased from the rearward end toward the frontward end so that tightness of insertion is increased in this direction. The inward side surface of each of the guide rails 35 forms an inclined guide surface 37 gradually narrowing in the rear-to-front direction.

Each of the manual handles 38 consists of a plate 39 to be inserted between the guide rails 35 as being guided by the inclined guide surface 37 and a U-formed handle 40 integrally shaped on the outer surface of the plate 39. The front end of the plate 39 is shaped in the form of an integral hook 41 having flexibility, which is engaged with the engagement cavity 36. The handle 40 is shaped in such an inclined fashion as to be lower in the rearward end and higher at the frontward end in consideration of the center of gravity of the wafer container box positioned somewhere between the center position and the front opening. Each of the manual handles having the above described structure is guided by the inclined guide surface 37 to fit to the guide rails 35 with tightness increasing in the rear-to-front direction so as to be positioned and fixed to the side mounting means at a proper mounting position in a demountable fashion.

In the wafer container box having the above described structure, the container box can be equipped with a robotic flange 21, a pair of guide rails 29 or a pair of manual handles 38 of a specific type only by selecting to meet the particular requirement of the process under various limitations of the production lines with omission of unnecessary accessory parts. Accordingly, the wafer container box of the present invention is absolutely free from drawbacks in storage and handling including the cleaning works without any increase in the weight of the container box per se or without any increase in the investment for facilities. When the contained box is wrapped in a plastic film bag, absolutely no troubles are encountered by contamination due to puncture or pinhole formation in the bag.

When the side rails 29 are not employed, the troubles due to interference of the side rails with the line equipment can never take place as a matter of course without necessitating an additional space for cleaning and storage of the wafer container boxes. Further advantages can be expected as compared with conventional wafer container boxes that the number of bolts for assemblage of the box can be minimized so as to improve the efficiency of the assembling and disassembling works along with absorption of the positioning errors without necessitating any additional parts for exact positioning. As a consequence of integral forming of alignment grooves for supporting wafer materials on the inward surface of each of the side walls of the box body, the wafer container box as a whole can be compact-sized as compared with conventional wafer container boxes. It is of course that the troubles due to electrostatic charging of the box can be almost completely dissolved since the various parts of the box body are shaped from a thermoplastic resin exhibiting permanent anti-static effects.

Even if electrostatic charging has taken place, it is possible to release the charges by grounding through the robotic flange 21 or other parts prior to contacting with the transportation machine or wafer-processing machine. Elimination of the electrostatic charging means that deposition of dust particles can be minimized during transportation or in the course of taking out the wafer materials from the box. Accordingly, the inventive wafer container boxes brought into a clean room never cause the troubles due to contamination of the clean room and occurrence of unacceptable products. Further it is possibly to undertake the techniques of two-color molding to obtain a wafer container box of the invention provided with a see-through window 10 of a transparent plastic resin without joint gaps with the body of the container box 1 so that the alignment condition of the wafer materials W contained in the container box 1 can readily be watched from outside without decreasing the air-tight sealability of the wafer container box.

While the wafer alignment supporting grooves 2 illustrated in the accompanying drawing each have a U-formed cross section, it is of course optional that the cross section is V-formed. Examples of the transparent plastic resin for molding of the see-through window 10 include polycarbonate resins, acrylic resins and polyether imide resins though not particularly limitative thereto. When the box body 1 as a whole is formed from an antistatic opaque resin, the see-through window 10 can be shaped integrally with the box body 1 without gaps therebetween by the techniques of two-color molding or insert molding. It is also optional that another see-through window is provided in the covering 12, which may have a double-wall structure with a void space therebetween, so as to enable automatic checking of the alignment condition of the wafer materials W contained in the wafer container box without removing the covering 12 by means of a photoelectric sensor.

It is further optional that the guide rails 18 are each shaped to have such a configuration that the height and width are gradually decreased from the rear side to the front side. The inclined guide surface 20 can be formed in such a fashion that the distance from the guide rail 18 is gradually decreased from the rear side to the front side. The engagement ribs 26 having a U-shaped or V-shaped cross section can be shaped in such a fashion that the inward surface thereof is in direct contact with the insertion part 31 of each of the side rails 29.

The flat plate 30 can be provided with one or more of fixing holes 33 in the areas excepting the end portions. The fastening bolt can be a metal bolt instead of a resin-made bolt. It is possible that each of the side walls is provided on the outer surface at the lower position with a cylindrical boss and a fixing boss arranged in the front-to-rear direction. The guide rails 35 can be shaped in such a fashion that the height thereof is gradually decreased from the rear side to the front side and the vertical width thereof is gradually increased from the rear side to the front side. The form of the handle 40 is not limited to the U-form but can be any other forms according to desire.

What is claimed is:

1. A wafer container box having of a body of the box opening in one lateral surface and a covering mountable on the opening of the box body for air-tight sealing of the container box, the container box comprising:
   (a) two sets of wafer alignment grooves each integrally formed on an inner surface of one of oppositely facing side walls of the box body for supporting a plurality of wafer materials aligned up to down each in a horizontal disposition;
   (b) a bottom plate fixed to a bottom surface of the box body;
   (c) an upper mounting means provided on a top wall of the box body for supporting a robotic flange in a demountable fashion;

(d) a lower side mounting means provided on an outer surface of each of the side walls of the box body for supporting a side rail in a demountable fashion; and (e) a side mounting means provided on the outer surface of each of the oppositely facing side walls of the box body for supporting a manual handle in a demountable fashion, wherein the members selected from the robotic flanges, side rails and manual handles are mounted selectively.

2. The wafer container box according to claim 1 wherein the upper mounting means (c) comprises a guide rail provided on the top wall of the box body and an inclined guide surface formed on the guide rail with inclination gradually increasing from an end surface opposite to the opening in the lateral surface toward the opening, and the robotic flange comprises a holding plate and a supporting prop provided on a lower surface of the holding plate to fit the guide rails as guided by the inclined guide surface.

3. The wafer container box according to claim 1 wherein the lower mounting means is formed in the form of an engagement rib provided on the outer surface of each side wall so as to define a space for insertion and the side rail comprises a flat plate, an insertion part provided on an inward end of the flat plate for engagement with the engagement rib and a horizontal supporting plate provided on an outward end of the flat plate.

4. The wafer container box according to claim 1 wherein the side mounting means comprises a guide rail provided on the outer surface of each side wall of the box body and an inclined guide surface with inclination gradually increasing from an end surface of the box body opposite to the opening toward the opening and the manual handle comprises a plate fitting the guide rail as being guided by the inclined guide surface and a handle provided on an outer surface of the plate.

5. The wafer container box according to claim 1 wherein a rearward wall of the box body is provided with a see-through window of a transparent material for inspection of the wafer materials contained therein.

6. The wafer container box according to claim 1 wherein the container box is made from a thermoplastic resin and has a surface resistivity in the range from $10^8$ to $10^{13}$ ohm.

* * * * *